(12) United States Patent
Umewaka et al.

(10) Patent No.: US 7,330,708 B2
(45) Date of Patent: Feb. 12, 2008

(54) TUNING CIRCUIT WITH AMPLITUDE ATTENUATION FUNCTION AND INTEGRATED CIRCUIT FOR RADIO COMMUNICATION APPARATUS

(75) Inventors: Masahiro Umewaka, Gunma-ken (JP); Hiroya Yamamoto, Gunma-ken (JP); Keitarou Sekine, Tokyo (JP); Akira Hyougo, Chiba (JP); Keiji Morijiri, Gunma-ken (JP)

(73) Assignees: Sanyo Electric Co., Ltd., Osaka (JP); Tokyo University of Science, Tokyo (JP)

( * ) Notice: Subject to any disclaimer, the term of this patent is extended or adjusted under 35 U.S.C. 154(b) by 462 days.

(21) Appl. No.: 11/001,460

(22) Filed: Nov. 30, 2004

(65) Prior Publication Data

US 2005/0147193 A1 Jul. 7, 2005

(30) Foreign Application Priority Data

Dec. 1, 2003 (JP) .............................. 2003-402049

(51) Int. Cl.
*H04B 1/18* (2006.01)
(52) U.S. Cl. ............................... 455/193.1; 455/193.2; 455/195; 455/120; 455/121; 340/10.3; 340/10.4
(58) Field of Classification Search ............. 455/193.1, 455/195.1, 193.2, 120, 121; 340/10.3, 10.4
See application file for complete search history.

(56) References Cited

U.S. PATENT DOCUMENTS

| 3,299,424 | A | * | 1/1967 | Vinding ..................... 340/10.3 |
| 5,396,410 | A | * | 3/1995 | Okochi et al. ........... 363/21.03 |
| 5,467,082 | A | * | 11/1995 | Sanderson ................. 340/5.61 |
| 6,167,236 | A | | 12/2000 | Kaiser |
| 6,720,866 | B1 | * | 4/2004 | Sorrells et al. ............ 340/10.4 |
| 7,171,178 | B2 | * | 1/2007 | Umewaka et al. ....... 455/195.1 |
| 2002/0190796 | A1 | | 12/2002 | Park |

FOREIGN PATENT DOCUMENTS

EP 0377257 7/1990
JP 10-023084 1/1998

(Continued)

OTHER PUBLICATIONS

European Patent Search, Application No. 04257480.6 by Sanyo Electronic Co., Ltd.et al., Search Report dated Sep. 27, 2006.

(Continued)

*Primary Examiner*—Sanh D. Phu
(74) *Attorney, Agent, or Firm*—SoCal IP Law Group LLP; Steven C. Sereboff; John E. Gunther

(57) ABSTRACT

There is disclosed a tuning circuit having a coil and a capacitor comprises a resistance-adjustment circuit connected in parallel with the coil and the capacitor. The resistance-adjustment circuit changes a resistance of the tuning circuit when resonant. The resistance-adjustment circuit comprises a series circuit of a resistor and a switching element having an ON-resistance smaller than the resistance of the resistor, and turning on/off the switching element causes the resistance of the tuning circuit when resonant to change.

9 Claims, 16 Drawing Sheets

FOREIGN PATENT DOCUMENTS

| | | |
|---|---|---|
| JP | 2003-234642 | 8/2003 |
| KR | 1998-049504 | 10/1998 |
| TW | 355895 | 4/1999 |

OTHER PUBLICATIONS

Keiji Morijiri et al., "A Wireless Communication System Suitable for Excessive Received Signal.", Jan. 24, 2003 (Japan).

Keiji Morijiri et al., "A Wireless Communication System Suitable for Excessive Received Signal by Using New Damping Circuits.", Jan. 24, 2003 (Japan).

Won-Seok Oh et al., "A CMOS Transponder IC USing a New Damping Circuit", Jun. 2002 (U.S.).

Taiwan Intellectual Property Office, Final OA Prior to Rejection, Application 93136917 by Sanyo Electronic Co., Ltd., Office Action dated Apr. 18, 2006.

* cited by examiner

TUNING CIRCUIT

TUNING CIRCUIT

TUNING CIRCUIT

VDD-VT VOLTAGE GENERATING CIRCUIT EXAMPLE

A/K VOLTAGE GENERATING CIRCUIT EXAMPLE

US 7,330,708 B2

TUNING CIRCUIT WITH AMPLITUDE ATTENUATION FUNCTION AND INTEGRATED CIRCUIT FOR RADIO COMMUNICATION APPARATUS

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by any one of the patent disclosure as it appears in the Patent and Trademark Office patent files or records, but otherwise reserves all copyright and trade dress rights whatsoever.

RELATED APPLICATION INFORMATION

The present application claims priority upon Japanese Patent Application No. 2003-402049 filed on Dec. 1, 2003, which is herein incorporated by reference.

BACKGROUND OF THE INVENTION

1. Field Of The Invention

The present invention relates to a tuning circuit with an amplitude attenuation function and an integrated circuit for radio communication apparatuses.

2. Description of the Related Art

FIG. 16 shows a typical example of a tuning circuit and an AGC (Automatic Gain Control) circuit in, for example, ASK (Amplitude Shift Keying) communication. The tuning circuit comprises an LC parallel resonance circuit where one ends of a coil (inductance) L1 and a capacitor (capacitance) C1 are connected to a reference voltage Vref. The AGC circuit is made up of a variable gain amplifier, a rectifier (REC), and a comparator (COMP). The variable gain amplifier adjusts the amplitude of an AC (alternate current) signal from the tuning circuit and outputs through its output terminal OUT. This output terminal OUT is connected to an amplifier, a detection circuit, and a waveform shaping circuit, which process the AC signal adjusted in amplitude. Refer to, e.g., Japanese Patent Application Laid-open Publication No. 10-23084.

The gain for the AC (alternate current) signal of the variable gain amplifier is determined in the rectifier and comparator. Specifically, after the rectifier produces a DC signal by smoothing the amplitude of the AC signal, the comparator compares this DC signal with a reference voltage VAGC. As a result of this comparing, when the amplitude of the AC signal is excessive, the comparator feeds back its output for decreasing the gain to the amplifier. Thus, the amplitude of the AC signal, which would otherwise be excessive, is controlled to be suppressed always being maintained at a given constant level.

Such a tuning circuit and an AGC circuit are used in, for example, the receiver of a remote control system. Such remote control systems have various applications such as the open and close and locking of doors of cars, houses and the like, and the start and stop of car engines.

When realizing the AGC function such as automatic control to reduce the amplitude of the AC signal when it is large, using an analog control system comprising the variable gain amplifier and the rectifier mentioned above renders power consumption large (about 1 µA in terms of electrical current). If this circuit large in power consumption is used in, e.g., a battery-operated-type receiver of a remote control system, the battery will be used up earlier.

SUMMARY OF THE INVENTION

One aspect of the present invention is a tuning circuit having a coil and a capacitor, comprising: a resistance-adjustment circuit connected in parallel with the coil and the capacitor, the resistance-adjustment circuit changing a resistance of the tuning circuit when resonant, the resistance-adjustment circuit comprising a series circuit of a resistor and a switching element having an ON-resistance smaller than the resistance of the resistor, wherein turning on/off the switching element causes the resistance of the tuning circuit when resonant to change.

Another aspect of the present invention is a tuning circuit having a coil and a capacitor, comprising: a switching element connected in parallel with the coil and the capacitor, the switching element changing a resistance of the tuning circuit when resonant, wherein changing the resistance by the switching element changes the amplitude of an output signal of the tuning circuit, the tuning circuit further comprising: a circuit to render an ON-resistance constant that eliminates dependency of the ON-resistance of the switching element on a power supply voltage, which is a source of a switching voltage for the switching element, and on temperature, wherein the circuit to render an ON-resistance constant supplies the switching element with the switching voltage to eliminate the dependency on the power supply voltage and on the temperature.

Features and objects of the present invention other than the above will become clear by reading the description of the present specification with reference to the accompanying drawings.

DESCRIPTION OF THE DRAWINGS

For a more complete understanding of the present invention and the advantages thereof, reference is now made to the following description taken in conjunction with the accompanying drawings wherein.

DETAILED DESCRIPTION OF THE INVENTION

Figure 1A:
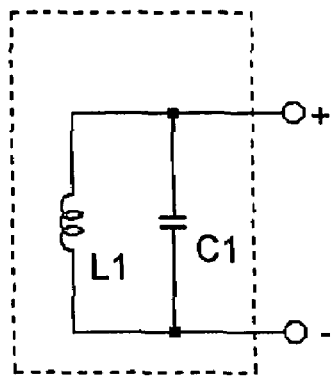
FIGS. 1A-1C are views showing the principle of a tuning circuit with an amplitude attenuation function according to an embodiment of the present invention in comparison with the conventional art.

At least the following matters will be made clear by the explanation in the present specification and the description of the accompanying drawings.

Outline

A tuning circuit having a coil and a capacitor according to the invention comprises a resistance-adjustment circuit connected in parallel with the coil and the capacitor, the resistance-adjustment circuit changing a resistance of the tuning circuit when resonant, the resistance-adjustment circuit comprising a series circuit of a resistor and a switching element having an ON-resistance smaller than the resistance of the resistor, wherein turning on/off the switching element causes the resistance of the tuning circuit when resonant to change.

Hence, the resistance of the tuning circuit is changed by the resistance-adjustment circuit, thereby changing the amplitude of an output signal of the tuning circuit. Thus, with the sensitivity of the tuning circuit being so high as to detect the minimal input signal, the amplitude of the output signal can be suppressed so as not to be excessive. Therefore, it has a broad dynamic range.

Moreover, since turning on/off the switching element to change the resistance of the tuning circuit, digital control is possible. Thus, compared with an analog control system comprising a variable gain amplifier and a rectifier, with the present invention, power consumption of the control system can be reduced because a variable gain amplifier and a rectifier are not used. Especially when the circuit of the present invention is used in a battery-operated-type apparatus, power consumption can be reduced for the battery having a limited capacity.

When, for example, a transistor is used as the switching element, the transistor varies in the ON resistance (resistance when ON) in response to the variation of the gate voltage when ON and temperature. Thus, when the transistor is used as a major element for resistance adjustment of the tuning circuit when resonant, it is not possible to accurately change the resistance of the tuning circuit when resonant, due to the variation of the gate voltage and temperature.

However, in the present invention, not a transistor but a simple resistor is used as the major component in resistance adjustment of the tuning circuit when resonant. This switching element as an auxiliary element having a small ON resistance that does not contribute to the resistance adjustment is connected in series with the resistor. This series circuit is used as a resistance-adjustment circuit. The resistor does not need a gate voltage and is less affected by the variation of temperature.

With this resistance-adjustment circuit, the resistance of the resistor determines the resistance of the tuning circuit at the time of resonance when the switching element having a small ON resistance is turned on, with the resistance of the tuning circuit being not affected by the variation of the gate voltage and temperature. Thus, the amplitude of the AC signal output from the tuning circuit can be attenuated without being affected by the variation of the gate voltage and temperature.

Furthermore, the switching element is constituted by a transistor, and turning on/off the transistor causes the resistance of the tuning circuit when resonant to change.

Thus, since the transistor is turned on/off to change the resistance of the tuning circuit, digital control is possible. Thus, compared with an analog control system, power consumption of the control system can be reduced. Especially when the circuit of the present invention is used in a battery-operated-type apparatus, power consumption can be reduced for the battery having a limited capacity.

Moreover, the tuning circuit further comprises an automatic adjustment circuit including a comparator that changes its output when the amplitude of an output signal of the tuning circuit becomes greater than a reference amplitude level for automatic adjustment; and a transistor driving digital circuit that outputs a digital drive signal to change a voltage applied to a control electrode of the transistor in response to the change in the output of the comparator.

In order to implement the amplitude attenuation function of the tuning circuit, the voltage-driving automatic adjustment circuit including a comparator and a transistor driving digital circuit is provided. Thus, compared with an analog control system, power consumption can be greatly reduced. Especially when the circuit of the present invention is used in a battery-operated-type apparatus, power consumption can be reduced for the battery having a limited capacity.

Moreover, a tuning circuit having a coil and a capacitor according to the present invention comprises a switching element connected in parallel with the coil and the capacitor, the switching element changing a resistance of the tuning circuit when resonant, and changing the resistance by the switching element changes the amplitude of an output signal of the tuning circuit. The tuning circuit further comprises a circuit to render an ON-resistance constant that eliminates dependency of the ON-resistance of the switching element on a power supply voltage, which is a source of a switching voltage for the switching element, and on temperature, and the circuit to render an ON-resistance constant supplies the switching element with the switching voltage to eliminate the dependency on the power supply voltage and on the temperature.

Hence, the resistance of the tuning circuit is changed by the resistance-adjustment circuit, thereby changing the amplitude of the output signal of the tuning circuit. Thus, with the sensitivity of the tuning circuit being so high as to detect the minimal input signal, the amplitude of the output signal can be suppressed so as not to be excessive. Therefore, it has a broad dynamic range.

Thus, since the transistor is turned on/off to change the resistance of the tuning circuit, digital control is possible. Thus, compared with an analog control system comprising a variable gain amplifier and a rectifier, with the present invention, power consumption of the control system can be reduced because a variable gain amplifier and a rectifier are not used. Especially when the circuit of the present invention is used in a battery-operated-type apparatus, power consumption can be reduced for the battery having a limited capacity.

When, for example, a transistor is used as the switching element, the transistor varies in the ON resistance (resistance when ON) in response to the variation of the gate voltage when ON and temperature. Thus, when the transistor is used as a switching element for resistance adjustment of the tuning circuit when resonant, it is not possible to accurately change the resistance of the tuning circuit when resonant, due to the variation of the gate voltage and temperature.

However, the present invention comprises a circuit to render an ON-resistance constant that eliminates dependency of the ON-resistance of the switching element on a power supply voltage, which is a source of a switching voltage for the switching element, and on temperature. Hence, the resistance of the tuning circuit at the time of resonance is rendered constant, without being affected by the variation of the gate voltage and temperature. Thus, the amplitude of the AC signal output from the tuning circuit can be attenuated without being affected by the variation of the gate voltage and temperature.

Moreover, the switching element is constituted by a transistor, and turning on/off the transistor causes the resistance of the tuning circuit when resonant to change.

Thus, since the transistor is turned on/off to change the resistance of the tuning circuit, digital control is possible. Thus, compared with an analog control system, power consumption of the control system can be reduced. Especially when the circuit of the present invention is used in a battery-operated-type apparatus, power consumption can be reduced for the battery having a limited capacity.

Furthermore, the tuning circuit further comprises a (VDD-$V_T$) voltage generating circuit to generate a difference voltage of (VDD-$V_T$) between the power supply voltage VDD and a threshold voltage $V_T$ of the transistor; and an A/K voltage generating circuit to generate an A/K voltage corresponding to the result of dividing a predetermined constant A by a trans-conductance coefficient K, and the circuit to render an ON-resistance constant generates, as the switching voltage applied to a control electrode of the transistor as the switching element, a voltage of $V_T$+A/K, equal to the sum of the threshold voltage $V_T$ and the A/K voltage, produced based on the voltage of (VDD-$V_T$) and the A/K voltage supplied so that the ON-resistance of the transistor equals the reciprocal of the predetermined constant A.

Moreover, the tuning circuit further comprises an automatic adjustment circuit including a comparator that changes its output when the amplitude of the output signal of the tuning circuit becomes greater than a reference amplitude level for automatic adjustment; and a transistor driving digital circuit that outputs a digital drive signal to change a voltage applied to a control electrode of the transistor in response to the change in the output of the comparator.

In order to implement the amplitude attenuation function of the tuning circuit, the voltage-driving automatic adjustment circuit including a comparator and a transistor driving digital circuit is provided. Thus, compared with an analog control system, power consumption can be greatly reduced. Especially when the circuit of the present invention is used in a battery-operated-type apparatus, power consumption can be reduced for the battery having a limited capacity.

An integrated circuit for a radio communication apparatus according to the present invention comprises the switching element and the automatic adjustment circuit in the above tuning circuit.

The resistance of the tuning circuit is changed by the resistance-adjustment circuit or the switching element, thereby changing the amplitude of an output signal of the tuning circuit. Thus, with the sensitivity of the tuning circuit being so high as to detect the minimal input signal, the amplitude of the output signal can be suppressed so as not to be excessive. Therefore, it has a broad dynamic range.

Further, the amplitude of the AC signal output from the tuning circuit can be attenuated without being affected by the variation of the gate voltage and temperature.

In order to implement the amplitude attenuation function of the tuning circuit, the voltage-driving automatic adjustment circuit is provided. Thus, compared with an analog control system, power consumption can be greatly reduced. Especially when the circuit of the present invention is used in a battery-operated-type apparatus, power consumption can be reduced for the battery having a limited capacity.

Principle

Figure 1B:
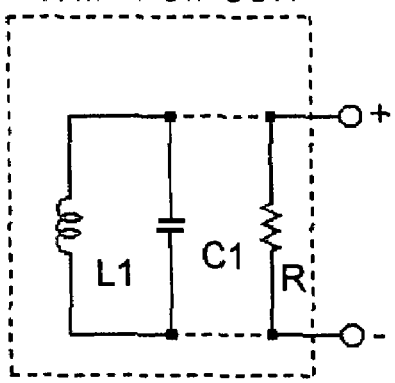
Figure 1C:
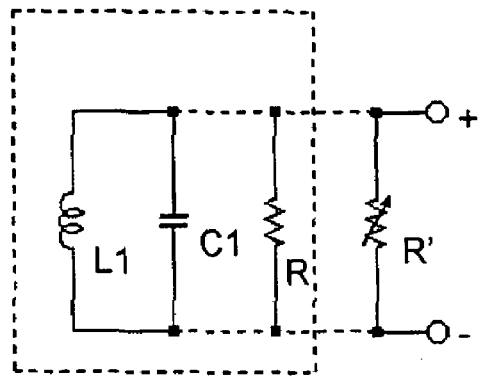

FIGS. 1A-1C are views for explaining the principle of a tuning circuit with an amplitude attenuation function according to the present embodiment. This tuning circuit is used in the antennas of transceivers in communication systems. As shown in the circuit diagram of FIGS. 1A-1C, a resistance-adjustment element R' is connected in parallel (FIG. 1C) with a coil L1 and a capacitor C1 of an LC parallel resonance circuit (FIG. 1A) constituting a tuning circuit. This resistance-adjustment element R' itself has a resistance, which is indicated by R' for convenience, and changes a resistance component R0 of the tuning circuit when resonant. The tuning circuit itself without the resistance-adjustment element R' connected has a resistance R when resonant (FIG. 1B). The resistance R0 of the tuning circuit with the resistance-adjustment element R' connected is expressed as the reciprocal of (1/R+1/R'). By changing the resistance R0 of the tuning circuit as described above, the Q value of the tuning circuit is changed on the basis of the equation Q=R0/($\omega$L1), where $\omega$ is an angular velocity and L1 is the inductance of coil L1. The change in the Q value causes the amplitude of the output signal of the tuning circuit to change in level. Note that the Q value indicates the selectivity, a characteristic, of the tuning circuit.

Because the resistance R' of the resistance-adjustment element R' is positive, the resistance R0 of the tuning circuit with the resistance-adjustment element R' connected is smaller than the resistance R for without the resistance-adjustment element R'. As the resistance R0 of the tuning circuit becomes smaller, the Q value decreases, and thus the amplitude of the AC signal, which would otherwise be excessive, can be controlled to be suppressed.

Basic Circuit

Figure 2:
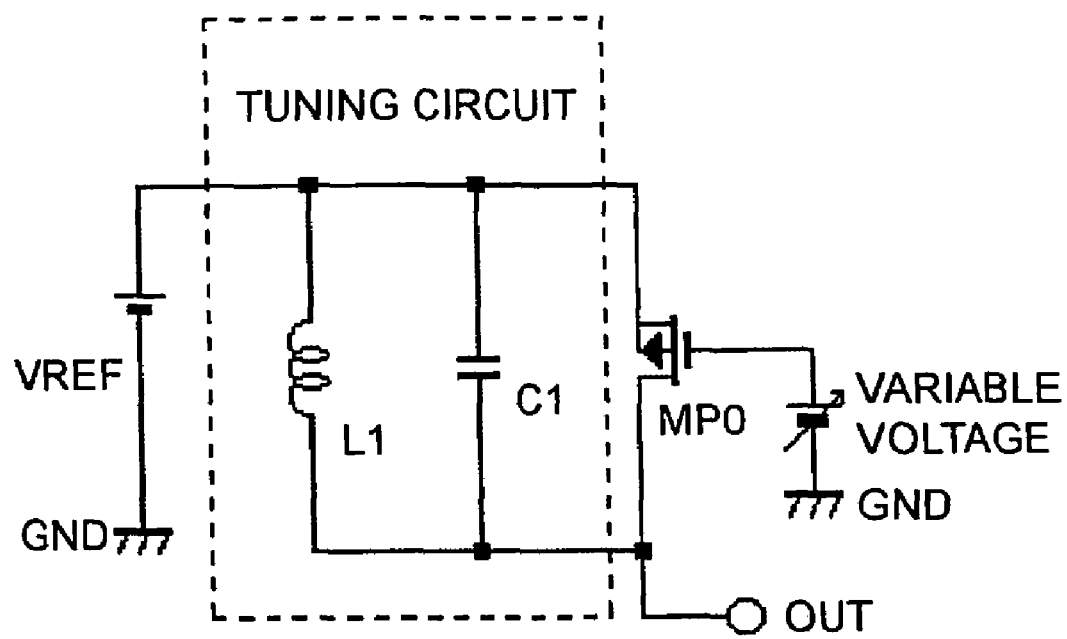
FIG. 2 is a circuit diagram of the tuning circuit with the amplitude attenuation function according to the embodiment of the present invention.

A basic circuit as a fundamental design based on the above-mentioned circuit of FIG. 1 is shown in FIG. 2. A transistor MP0 constitutes an element corresponding to the resistance-adjustment element R' of FIG. 1. In this embodiment, the transistor MP0 is a p-type channel MOSFET. A reference voltage Vref (e.g., 3V) is applied to one ends (on the left side of the drawing) of the coil L1 and the capacitor C1 constituting an LC parallel resonance circuit, that is a tuning circuit. An AC signal resonant in this LC parallel resonance circuit is output through an output terminal (the other terminal) OUT of the coil L1 and capacitor C1.

And by changing a voltage applied to the gate (control electrode) of the transistor MP0, the resistance R0 of the tuning circuit is changed. When changing the voltage applied to the gate of the transistor MP0, there exist two methods: a digital drive method where the transistor MP0 is used as a switching element and an analog drive method where the transistor MP0 is driven to be in between ON and OFF. In, for example, a discrete, analog drive method, the voltage applied to the gate of the transistor MP0 is set to discrete values between 0V (ON voltage) and 5V (OFF voltage) (e.g., 1V, 2V, 3V) one at a time. By this means, a plurality of discrete resistances can be realized between the drain and source of the transistor MP0. The amplitude level of the AC signal can be accurately controlled based on the plurality of discrete resistances.

Next, the digital drive method where the transistor MP0 is driven as a switching element to be ON and OFF will be described. That is, the voltage applied to the gate of the transistor MP0 is either 0V (ON voltage) or 5V (OFF voltage). For example, when the transistor MP0 becomes ON, the resistance of the tuning circuit changes, and thereby the amplitude level of the AC signal from the output terminal OUT can be adjusted.

Next, an example where a tuning circuit with the AGC function is realized by adding an AGC circuit (automatic adjustment circuit) to the tuning circuit of FIG. 2 is explained with reference to FIG. 3. The AGC circuit connected to the tuning circuit comprises a level shift circuit, a hysteresis comparator, and a transistor-driving digital circuit.

Figure 16:
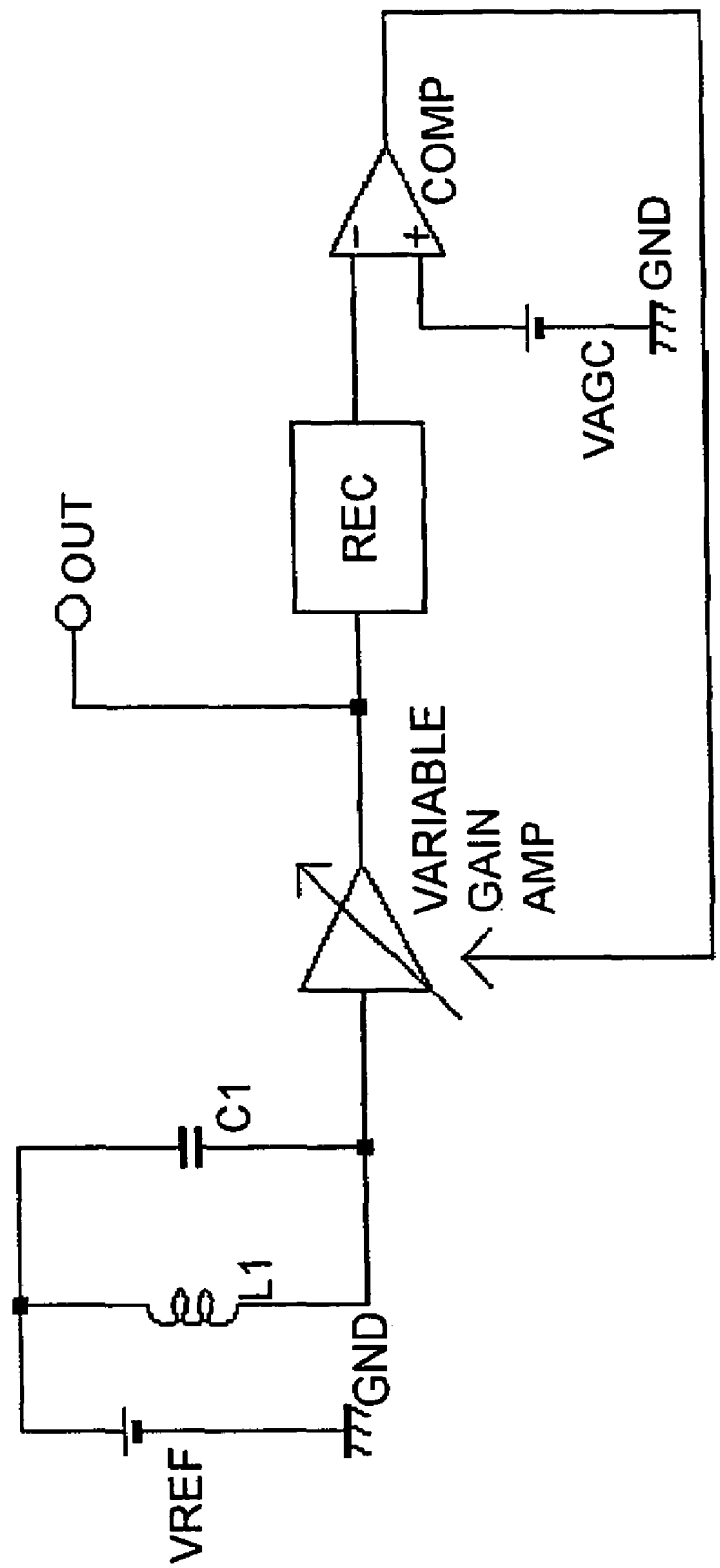
FIG. 16 is a circuit diagram of a conventional tuning circuit with the amplitude attenuation function.

In the present invention, on the basis of the principle of amplitude attenuation explained with reference to FIG. 1, analog circuits such as the variable gain amplifier and the rectifier need not be used like the conventional circuit shown in FIG. 16. Therefore, power consumption can be greatly reduced.

First, the function of the AGC circuit will be described. The hysteresis comparator changes its output when the amplitude of the AC signal (output signal) from the tuning circuit is at or above a reference amplitude level for automatic adjustment. In response to the change in the output of the hysteresis comparator, the transistor-driving digital circuit outputs a digital drive signal VAGC for changing the voltage applied to the gate of the transistor MP0.

When inputting the AC signal from the tuning circuit to the hysteresis comparator, the level shift circuit has a function to shift the DC level of the AC signal to match the DC level of the hysteresis comparator. In the present embodiment, the reference voltage Vref of 3V is applied to the tuning circuit, and hence, when turning on the transistor MP0 to change the resistance, the tuning circuit outputs an AC signal superposed on a DC voltage of about 3V. The level shift circuit shifts the DC voltage component of about 3V to a DC level sufficiently suitable for the hysteresis comparator to operate, and also produces a center voltage of the reference amplitude level for automatic adjustment that is a comparison reference of the hysteresis comparator.

Next, the specific circuit configurations of the level shift circuit, the hysteresis comparator, and the transistor-driving digital circuit will be described below. First, the level shift circuit is constituted by a level shift circuit including a current mirror circuit. As shown in FIG. 3, the level shift circuit comprises a level shifter and a current mirror circuit.

The level shifter comprises a transistor (n-type channel MOSFET) MN1, a transistor (n-type channel MOSFET) MN2, a transistor (n-type channel MOSFET) MN3, and a transistor (n-type channel MOSFET) MN4. The AC signal from the tuning circuit is input to the gate of the transistor MN2. The drain and gate of the transistor MN4 are connected to make the transistor MN4 work as a diode.

The current mirror circuit has a constant current source supplying a constant current I1 and a transistor (n-type channel MOSFET) MN5. The constant current I1 supplied by the constant current source plays a major part in producing the reference voltage (reference amplitude level for automatic adjustment) applied to the inverting input terminal of the hysteresis comparator. The drain and gate of the transistor MN5 are connected to each other and to the gate of the transistor MN3. The gate of the transistor MN3 is connected to the gate of the transistor MN1 of the level shifter and the drain of the transistor MN3 is connected to the source of the transistor MN4. Furthermore, the transistors MN2 and MN4 are matched and set such that the DC voltages at the sources of them are equal. In the circuit example of FIG. 3, a DC level lower by gate-to-source voltage VGS of the transistors MN2 and MN4 than 3V is produced at the sources of the transistors MN2 and MN4.

In the level shift circuit having such a configuration, the source of the transistors MN2 is connected to the non-inverting input terminal (+) of the hysteresis comparator, and in contrast, the source of the transistors MN4 is connected to the inverting input terminal (−) of the hysteresis comparator. The same DC voltage of (3V−VGS) is applied to the non-inverting and inverting input terminals of the hysteresis comparator. That is, only the DC voltage is applied to the inverting input terminal of the hysteresis comparator. The hysteresis comparator has hysteresis with this DC voltage, the reference voltage (reference amplitude level for automatic adjustment), as the center. In contrast, the signal produced by shifting the DC level of the AC signal from the tuning circuit to (3V−VGS) is applied to the non-inverting input terminal of the hysteresis comparator. That is, the hysteresis comparator compares the amplitude of the level-shifted AC signal with the reference voltage and, as the amplitude of the AC signal becomes greater than the reference voltage, changes its output from "L" to "H". The output of the hysteresis comparator is input to the transistor-driving digital circuit.

The transistor-driving digital circuit, in response to the change in the output of the hysteresis comparator, outputs a digital driving signal for changing the voltage applied to the gate of the transistors MP0. The transistor-driving digital circuit is a voltage-driving circuit and comprises a D flip-flop FD2 with a reset, an RSFF circuit (set reset flip-flop) made up of two NORs NR1, NR2, and a NAND ND1.

The output of the hysteresis comparator is applied to the clock terminal C of D flip-flop FD2. The data terminal D and output terminal Q of D flip-flop FD2 are connected to a power supply VDD and one input terminal (reset terminal) of NOR NR1 respectively. And a reset terminal RESET is connected to the reset terminal RN of D flip-flop FD2 and to one input terminal of NAND ND1 as well. The other input terminal of NAND ND1 is connected to power supply VDD and the output terminal of NAND ND1 is connected to one input terminal (set terminal) of NOR NR2 of the RSFF circuit. Instead of NAND ND1, alternative means having a function of inverter can be used. Note that the RSFF circuit is configured to have the two NORs NR1, NR2 as well known. NOR NR1 outputs the digital drive signal VAGC. A D flip-flop with a reset may be used as the RSFF circuit.

AGC operation will be described centered on the transistor-driving digital circuit with reference to the waveform view of FIG. 4. First, up to time T0 in FIG. 4, the transistor-driving digital circuit is in a reset state where the level-shifted AC signal from the tuning circuit is not input to the hysteresis comparator. The states of the signals during this period are as follows. The output of the hysteresis comparator (indicated by C in FIGS. 3, 4), the output of D flip-flop FD2 (indicated by Q in FIGS. 3, 4), and the output of NAND ND1 (waveform marked as "output of NAND ND1" in FIG. 4) are at a "L" level. Meanwhile, the output of NOR NR1 (digital drive signal VAGC, indicated by VAGC in FIGS. 3, 4) and the voltage applied to reset terminal RESET are at an "H" level.

Figure 4:
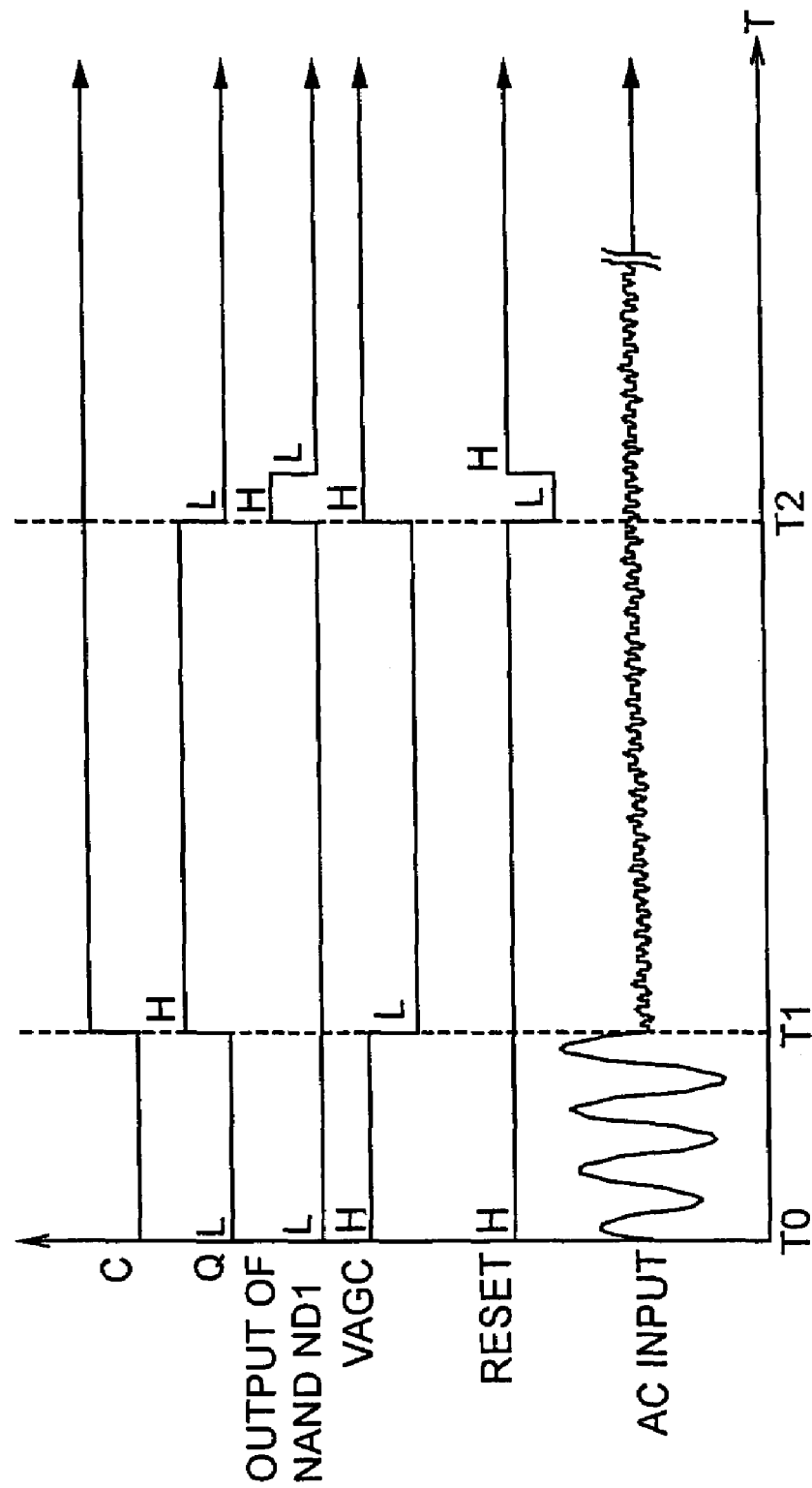
FIG. 4 is a waveform view showing the states of signals of a transistor-driving digital circuit of FIG. 3.

Then, after time T0 in FIG. 4, the level-shifted AC signal from the tuning circuit is input to the hysteresis comparator. The case when the amplitude of the AC signal is excessive will be described below. In first several milliseconds from the time when an AC signal having an excessive amplitude starts to be input to the hysteresis comparator (from time T0 to T1), the hysteresis comparator changes its output C from "L" to "H" because the input level to the non-inverting input terminal is greater than the reference voltage to the inverting input terminal. Then, output Q of D flip-flop FD2 becomes inverted, i.e., the "H" level, and thereby, the RSFF circuit is reset and digital drive signal VAGC is inverted to be at the "L" level. As a result, the transistor MP0 becomes ON, AGC for the tuning circuit as described above starts to work so as to suppress the amplitude of the AC signal.

Note that the voltage applied to reset terminal RESET is maintained at the "H" level. By this means, digital drive signal VAGC is held at the "L" level and the transistor MP0, a resistance-adjustment element, is held in an ON state. Thus, the stop of AGC operation can be prevented.

Thereafter, in order to stop the AGC operation and initialize the signal state of each part, a reset pulse signal is applied to reset terminal RESET (at time T2). Thereby, output Q of D flip-flop FD2 returns to the "L" level. At the same time, NAND ND1 outputs a "H" pulse signal in response to the reset pulse signal. In response to the rise of this "H" pulse signal, the RSFF circuit is set and digital drive signal VAGC is inverted to be at the "H" level. As a result, the transistor MP0 becomes OFF, thereby stopping the above AGC operation for the tuning circuit.

Figure 3:
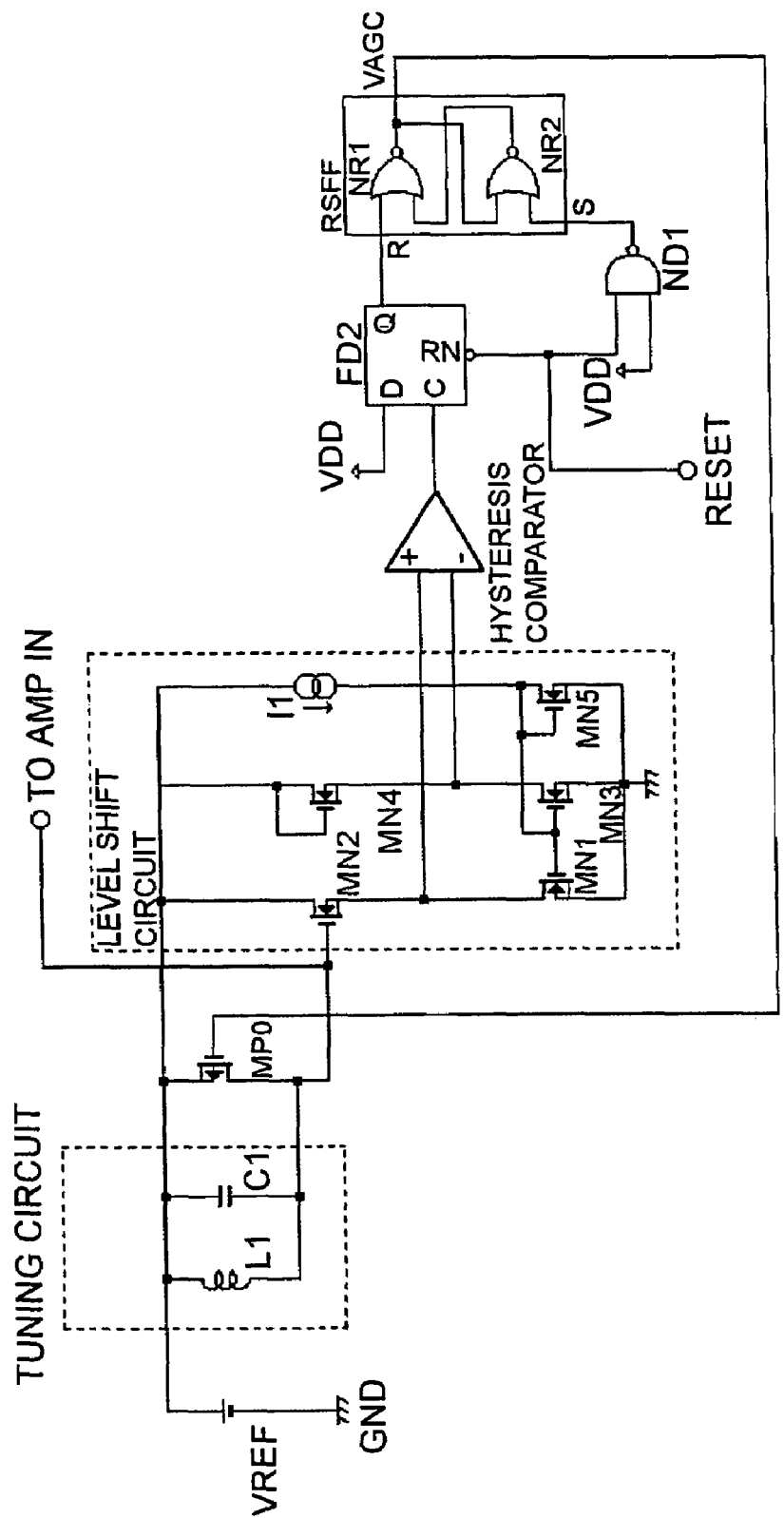
FIG. 3 is a circuit diagram of the tuning circuit with an AGC function according to the embodiment of the present invention.

Moreover, a D flip-flop with a reset may be used instead of the RSFF circuit of FIG. 3 so that its output works in the same way as the VAGC.

Figure 5:
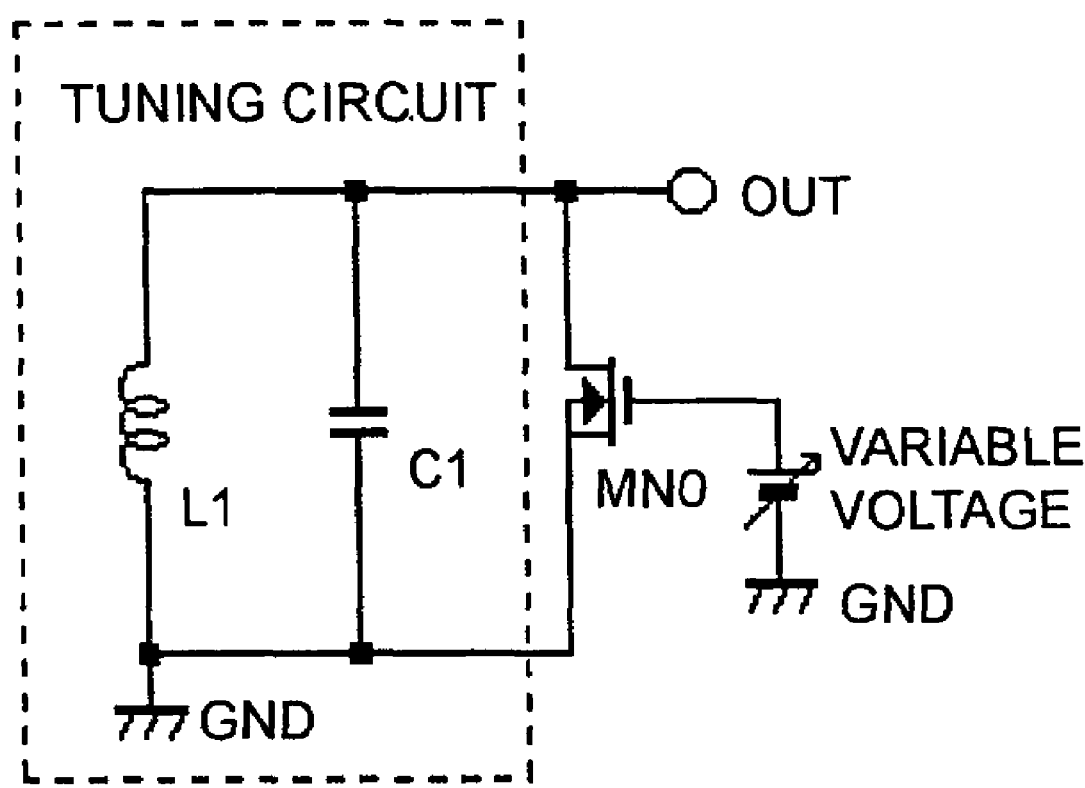
FIG. 5 is a view showing the principle of a modified example according to the embodiment of the present invention.
Figure 6:
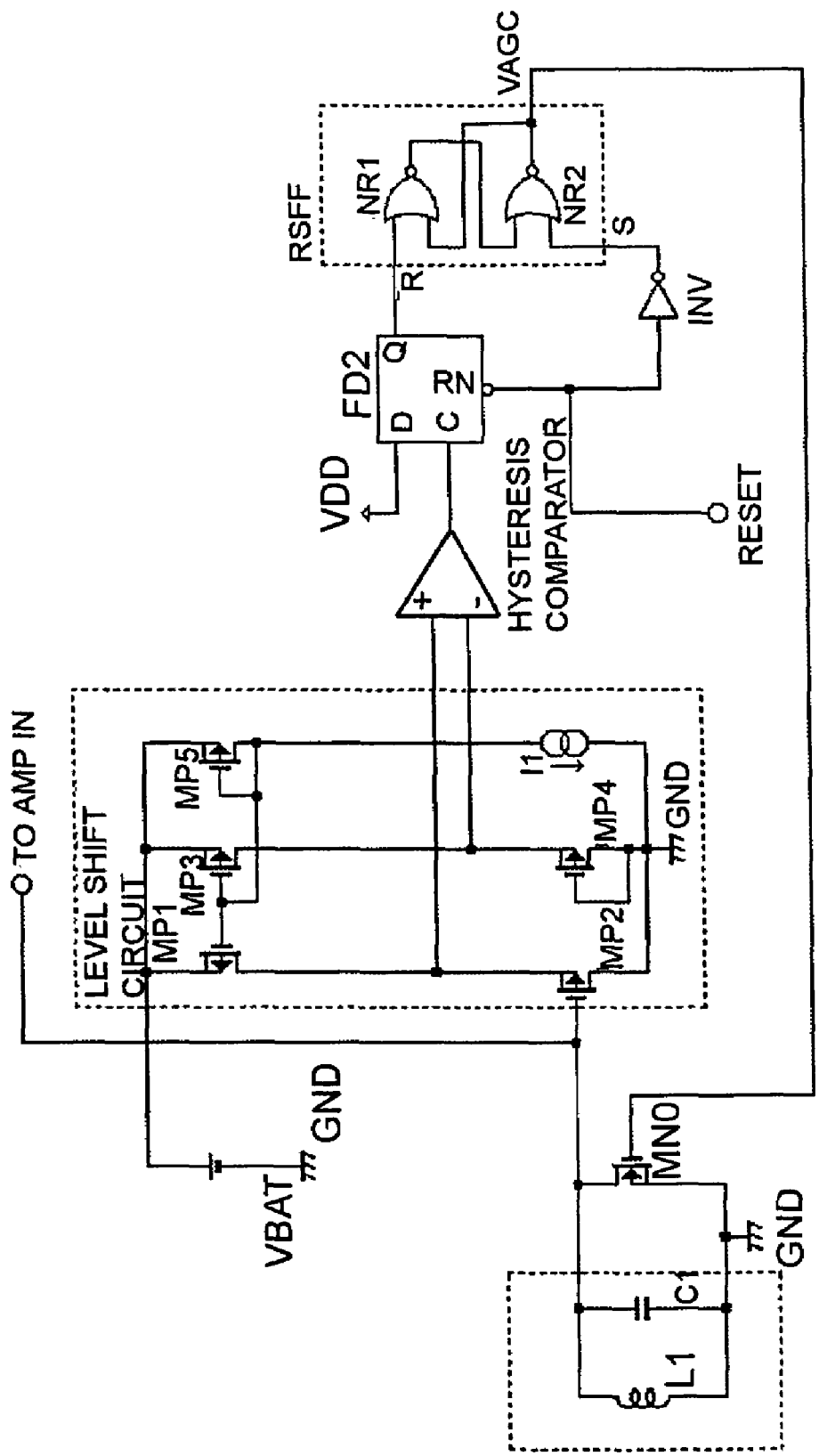
FIG. 6 is a circuit diagram of the modified example of the tuning circuit with the amplitude attenuation function according to the embodiment of the present invention.

A modified example of the embodiment described with reference to FIGS. 1 to 4 is shown in FIGS. 5, 6 and the modified part will be described below. That is, as shown in FIG. 5, the resistance-adjustment element R' of FIG. 1 is constituted by a transistor MN0 that is an n-type channel MOSFET. One ends (on the left side of the drawing) of the coil L1 and the capacitor C1 constituting an LC parallel resonance circuit, a tuning circuit, are connected to ground (GND). An AC signal resonant in this LC parallel resonance circuit is output through an output terminal (the other terminal) OUT of the coil L1 and capacitor C1.

According to the modification that an n-type channel MOSFET transistor MN0 is used as the resistance-adjustment element R' and that one ends of the coil L1 and the capacitor C1 are connected to ground, as shown in FIG. 6, the level shifter of the level shift circuit comprises a transistor (p-type channel MOSFET) MP1, a transistor (p-type channel MOSFET) MP2, a transistor (p-type channel MOSFET) MP3, and a transistor (p-type channel MOSFET) MP4. The current mirror circuit thereof has a constant current source supplying a constant current I1 and a transistor (p-type channel MOSFET) MP5. The drain and gate of the transistor MP5 are connected to each other and to the gates of the transistors MP1, MP3. Furthermore, the transistors MP2 and MP4 are matched and set such that the DC voltages at the sources of them are equal. In the circuit example of FIG. 6, a DC level higher by gate-to-source voltage VGS of the transistors MP2 and MP4 than GND is produced at the sources of the transistors MP2 and MP4.

Moreover, the connection relationship in the RSFF circuit outputting digital drive signal VAGC is different from the case of FIG. 3. The RSFF circuit is configured and internally connected as well known. That is, in FIG. 6, one input terminal of NOR NR2 of the RSFF circuit is connected to the output of an inverter INV and one input terminal of NOR NR1 of the RSFF circuit is connected to the output terminal Q of D flip-flop FD2. Hence, when the output Q of D flip-flop FD2 is at "H", the RSFF circuit is set and thereby outputs digital drive signal VAGC of the "H" level.

The operation of the circuit shown in FIG. 6 is similar to that of the case of FIG. 3. That is, an AC signal resonant in the tuning circuit is transmitted via the level shift circuit to the hysteresis comparator. When the amplitude level of the AC signal becomes so large as to be greater than the reference voltage (reference amplitude level for automatic adjustment), the output of the hysteresis comparator changes from "L" to "H". As a result, digital drive signal VAGC from the RSFF circuit changes from "L" to "H", thereby putting the transistor MN0 in an ON state and thus starting AGC operation.

Note that in order to stop the AGC operation and initialize the signal state of each part, the signal applied to reset terminal RESET is changed from "H" to "L".

Figure 7:
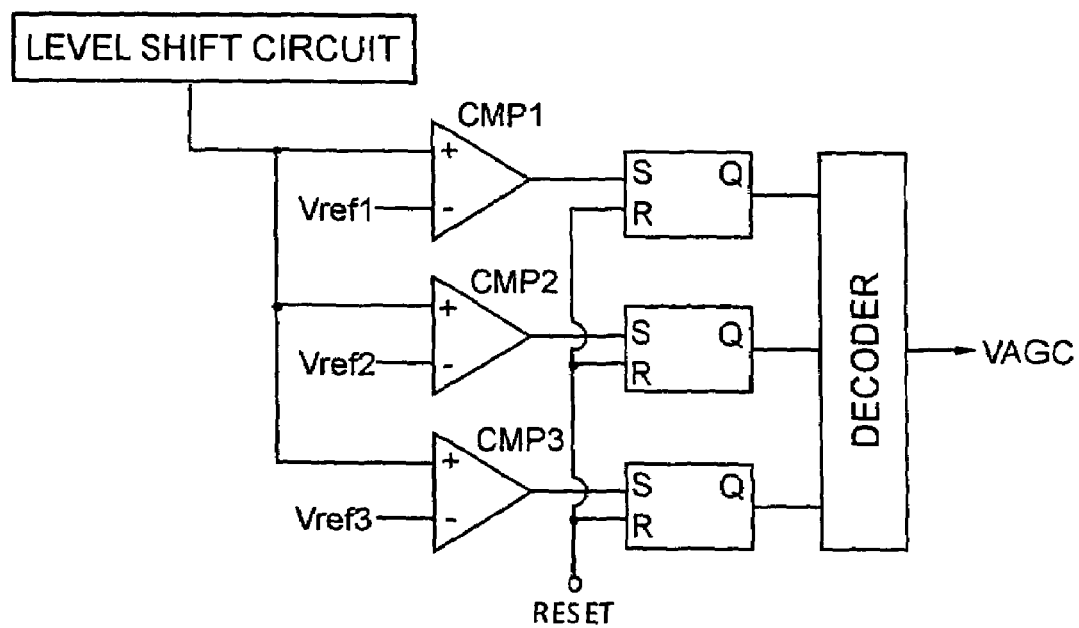
FIG. 7 is a partial circuit diagram of a tuning circuit of an analog drive method with the amplitude attenuation function according to the embodiment of the present invention.

Here, a specific example of the discrete, analog drive method will be described. In FIG. 3 or 6, the voltage (drive signal VAGC) applied to the gate of the transistor MP0 or MN0 is set to a plurality of values such as 1V, 2V, and 3V one at a time. Specifically, in FIG. 3 or 6, a plurality of (herein, three) hysteresis comparators CMP1, CMP2, CMP3 and respective RS flip-flops RSFF1, RSFF2, RSFF3 each form a stage and those stages are connected in parallel as shown in FIG. 7. The output terminals of these RS flip-flops RSFF1 to RSFF3 are connected to a decoder, which outputs drive signal VAGC.

A reference voltage Vref1 is input to the inverting input terminal of hysteresis comparator CMP1 to generate drive signal VAGC. A reference voltage Vref2 is input to the inverting input terminal of hysteresis comparator CMP2 to generate drive signal VAGC of 2V in level. A reference voltage Vref3 is input to the inverting input terminal of hysteresis comparator CMP3 to generate drive signal VAGC of 1V in level.

The output of the above level shift circuit is applied to the non-inverting input terminals of hysteresis comparators CMP1 to CMP3, which output results of comparing it with the respective reference voltages Vref1 to Vref3. In response to the outputs of these hysteresis comparators CMP1 to CMP3, RS flip-flops RSFF1 to RSFF3 output three-bit data (four values: HHH, HHL, HLL, and LLL) to the decoder. This decoder generates drive signal VAGC of 1V, 2V, or 3V that is selected depending on the three-bit data and outputs to transistor MP0 or MN0.

A D flip-flop with a reset may be used as the RSFF circuit of FIG. 6 as well so that its output works in the same way as the VAGC.

EXAMPLE 1

The basic circuits described as fundamental designs with reference to FIGS. 2 to 7 have the following characteristic items that need improvement.

That is, in the basic circuit shown in FIG. 5, a transistor (switching element) MN0 constituted by an n-type channel MOSFET varies in ON resistance (resistance when ON) in response to the variation of the gate voltage when ON and temperature. That is, transistor MN0 cannot accurately change the resistance R0 at the time of resonance of the tuning circuit due to the variation of the gate voltage and temperature.

Figure 8A:
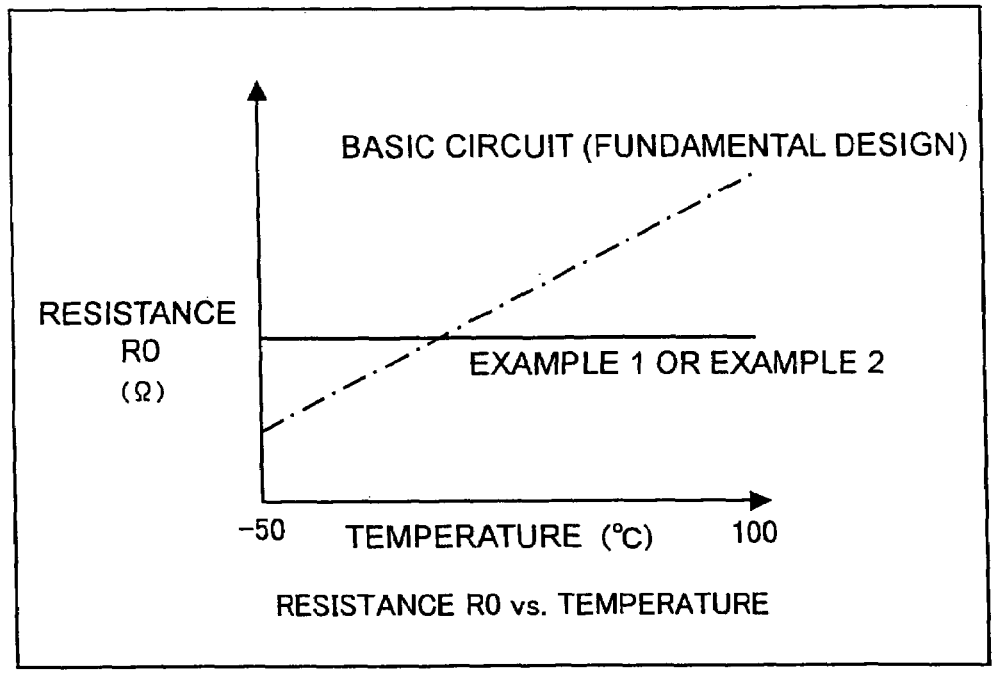
FIG. 8*a* is a characteristic graph of resistance R0 against temperature when resonant of the tuning circuit with the amplitude attenuation function according to the embodiment of the present invention.

Specifically, as shown in the characteristic graph of resistance R0 against temperature of FIG. 8A, in the case of the basic circuit indicated by an alternate long and short dashed line, resistance R0 increases and is not constant as temperature rises in the range of −50° C. to 100° C. Furthermore, as shown in the characteristic graph of resistance R0 against power supply voltage VDD applied to the gate of the transistor of FIG. 8B, in the case of the basic circuit indicated by an alternate long and short dashed line, resistance R0 decreases and is not constant as power supply voltage VDD rises in the range of 1.5V to 3.5V.

Figure 9:
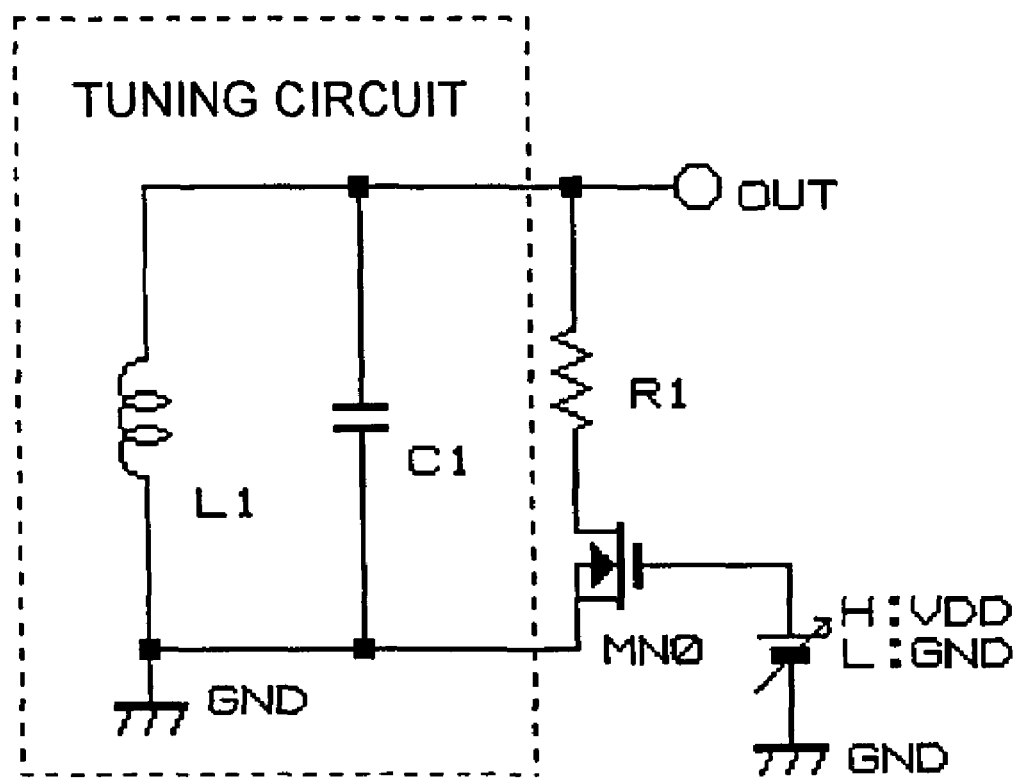
FIG. 9 is a circuit diagram of a tuning circuit with the amplitude attenuation function according to Example 1 of the present invention.

Accordingly, in an aspect of the invention, improvement is made as shown in the circuit diagram of FIG. 9. That is, a resistance-adjustment circuit for changing the resistance of a tuning circuit when resonant is connected in parallel with the coil L1 and the capacitor C1. This resistance-adjustment circuit includes a series circuit of a resistor R1 and a transistor (switching element) MN0. This transistor MN0 is constituted by an n-type channel MOSFET having smaller resistance than that of resistor R1.

By turning on and off transistor MN0, the resistance of the tuning circuit when resonant is changed. When the amplitude level of the AC signal from output terminal OUT need not be adjusted, the gate of transistor MN0 is held at ground level (GND) to be in an OFF state.

In order to turn on transistor MN0, power supply voltage VDD is applied to the gate thereof. In this case, the resistance of the tuning circuit when resonant is the combined resistance of that of resistor R1 and the resistance component of the tuning circuit. As a result, the amplitude level of the AC signal from output terminal OUT is adjusted to be attenuated.

When transistor MN0 is ON, since being smaller than the resistance of resistor R1, its ON resistance contributes little to the resistance when resonant of the tuning circuit. Thus, the influence of the variation in the ON resistance in response to the variation of the gate voltage and temperature on the resistance when resonant of the tuning circuit can be eliminated or reduced to a negligible degree.

Specifically, as shown in the characteristic graph of resistance R0 against temperature of FIG. 8A, in the case of the Example 1 indicated by a solid line, resistance R0 is maintained constant as temperature changes in the range of −50° C. to 100° C. Furthermore, as shown in the characteristic graph of resistance R0 against power supply voltage VDD applied to the gate of the transistor of FIG. 8B, in the case of the Example 1 indicated by a solid line, resistance R0 is maintained constant as power supply voltage VDD changes in the range of 1.5V to 3.5V.

Figure 10A:
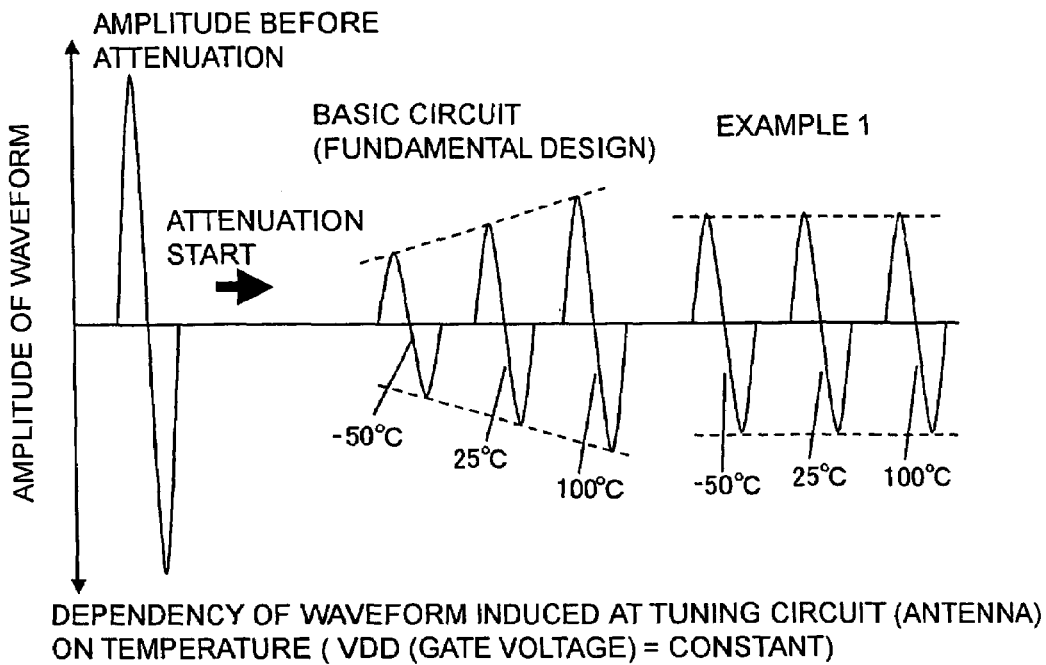
FIGS. 10A and 10B are characteristic graphs of resistance R0 against gate voltage and temperature of the tuning circuit with the amplitude attenuation function according to the embodiment of the present invention.

The effect of minimizing the influence of the variation in the gate voltage and temperature on the resistance R0 will be explained with reference to the waveform views of FIGS. 10A, 10B. First, under the condition of the gate voltage (equal to VDD) being constant, in the characteristic of resistance R0 against temperature, the waveform of the AC signal output from the tuning circuit is large in amplitude before AGC operates to attenuate, as shown in the left side of FIG. 10A. And when AGC operates to attenuate the AC signal, with the basic circuit previously described, the degree of attenuation varies according to the variation in the temperature (−50° C., 25° C., 100° C.) and is not constant as shown in the center. On the other hand, in this Example 1, the attenuated amplitude of the AC signal is constant even if the temperature changes.

Figure 10B:
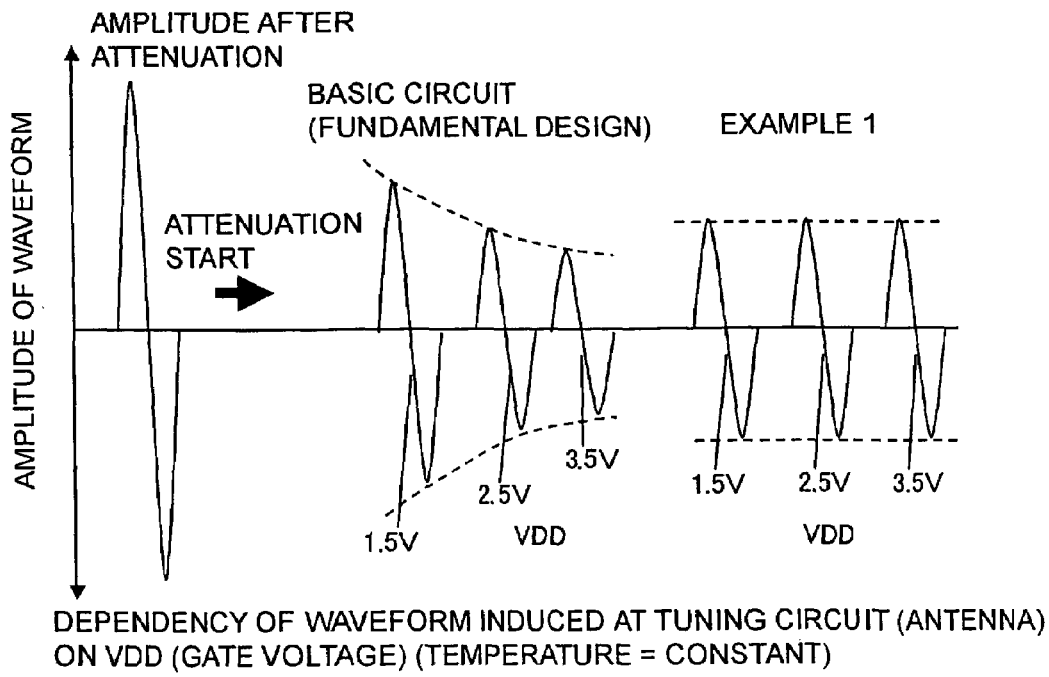

Next, under the condition of the temperature being constant, in the characteristic of resistance R0 against the gate voltage (equal to VDD), the waveform of the AC signal output from the tuning circuit is large in amplitude before AGC operates to attenuate, as shown in the left side of FIG. 10B. And when AGC operates to attenuate the AC signal, with the basic circuit previously described, the degree of attenuation varies according to the variation in the gate voltage (1.5V, 2.5V, 3.5V) and is not constant as shown in the center. On the other hand, in this Example 1, the attenuated amplitude of the AC signal is constant even if the gate voltage varies.

Note that an example where a tuning circuit with the AGC function is realized by adding an AGC circuit (automatic adjustment circuit) to the tuning circuit of FIG. 9 is similar to the above case of FIG. 6 and to the case of FIG. 11 described later.

Moreover, the aspect of the invention described by way of this example related to the above items to be improved can be applied to the basic circuit of the type shown in FIG. 2.

EXAMPLE 2

Outline

Another aspect of the invention intended for the above to-be-improved items as mentioned in the Example 1 will be described with reference to the circuit diagram of FIG. 11. Note that the present circuit is based on the basic circuit of FIG. 6 and thus a description is made below centered on differences from that in FIG. 6. A switching element as a resistance-adjustment element for changing the resistance of a tuning circuit when resonant is connected in parallel with the coil L1 and the capacitor C1. This switching element is constituted by a transistor MN0 that is an n-type channel MOSFET. By changing the resistance R0 of transistor MN0, the output signal amplitude of the tuning circuit is changed. The output signal from the inverted output terminal QN of D flip-flop FD2 is used as digital drive signal VAGC.

And a circuit to render the ON-resistance constant is provided for eliminating the dependency of transistor MN0's ON-resistance on power supply voltage VDD, which is a source of a switching voltage, and on the temperature. This circuit to render the ON-resistance constant supplies the gate of transistor MN0 with an applied voltage Vo not subject to the variation of power supply voltage VDD and the temperature.

Detailed Description

Figure 11:
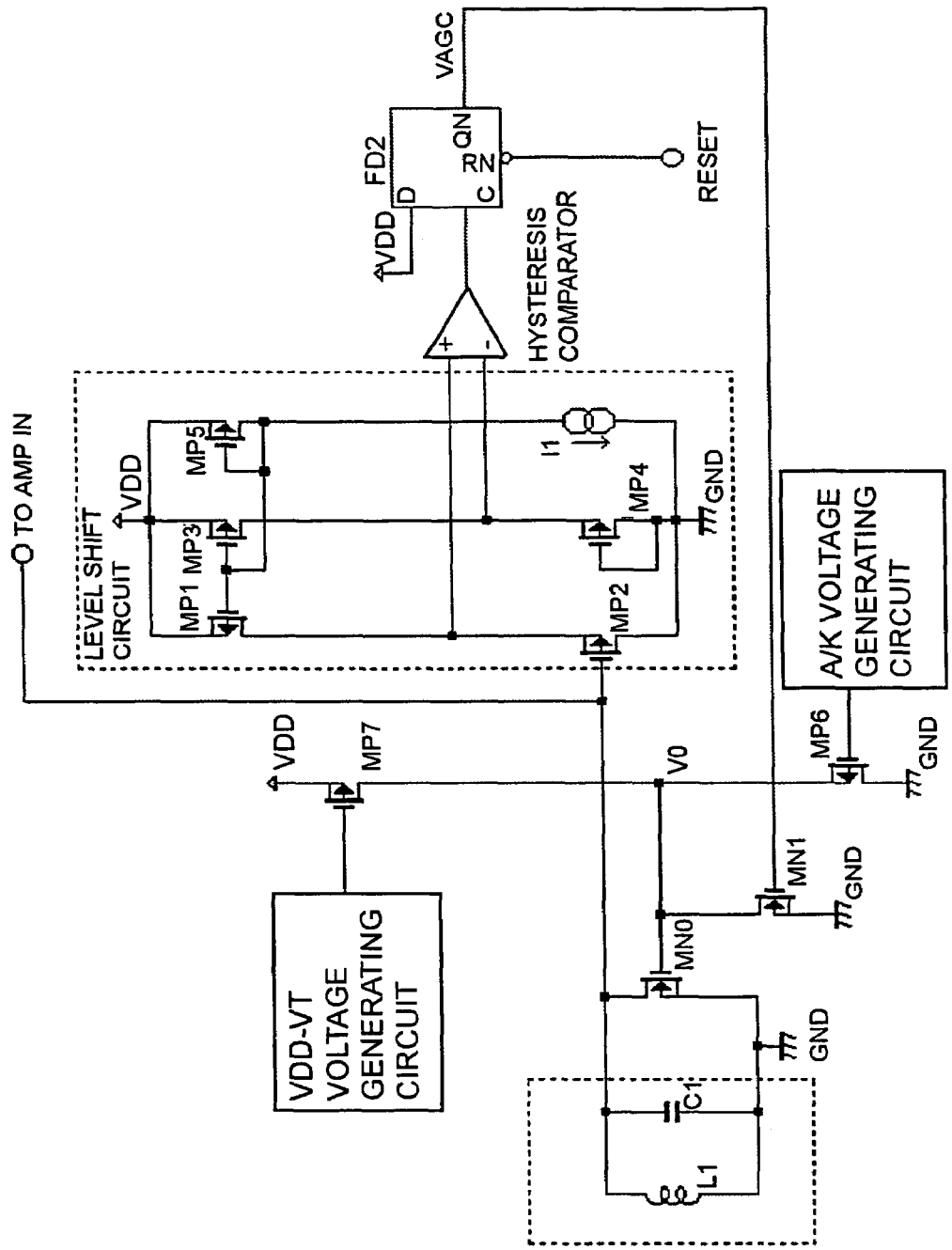
FIG. 11 is a circuit diagram of a tuning circuit with the amplitude attenuation function according to Example 2 of the present invention.

As shown in FIG. 11, the ON-resistance (drain-to-source resistance) R' of transistor MN0 is expressed as $1/K(V_{gs}-$ $V_T$), where K is its trans-conductance coefficient, $V_{gs}$ is the gate-to-source voltage (gate voltage or switching voltage), and $V_T$ is the threshold voltage. In the basic circuit previously described, since gate-to-source voltage $V_{gs}$ is equal to power supply voltage VDD, the ON-resistance is dependent on the VDD, and the K and $V_T$ are dependent on temperature.

Accordingly, in Example 2, by supplying such a gate voltage Vo that $V_{gs}=V_T+A/K$ to transistor MN0, where A is a constant, the ON-resistance R'=1/A. Thus, its dependency on power supply voltage VDD and temperature is eliminated.

First, the circuit diagram of FIG. 11 differs from the circuit diagram of FIG. 6 in that the inverter INV and RSFF circuit are removed and that the output signal from the terminal QN of D flip-flop FD2 is used as digital drive signal VAGC. The circuit diagram of FIG. 11 comprises, as components for supplying gate voltage Vo such that $V_{gs}=V_T+A/K$, a transistor MN1 constituted by an n-type channel MOSFET, transistors MP6, MP7 constituted by p-type channel MOSFETs, a (VDD–$V_T$) voltage generating circuit, and an A/K voltage generating circuit. As described later, the (VDD–$V_T$) voltage generating circuit is a circuit to generate a difference voltage of VDD and $V_T$, and the A/K voltage generating circuit is a circuit to generate a voltage corresponding to A/K (hereinafter, called A/K voltage).

As shown in FIG. 11, the gate of transistor MN0 to which gate voltage Vo is applied is connected to the drain of transistor MN1, the source of transistor MP6 and to the drain of transistor MP7. The A/K voltage from the A/K voltage generating circuit is applied to the gate of transistor MP6 and the drain thereof is connected to ground. The (VDD–$V_T$) voltage from the (VDD–$V_T$) voltage generating circuit is applied to the gate of transistor MP7 and the source thereof is connected to power supply VDD.

The (VDD–VT) voltage generating circuit applies a voltage Vo1 that is the voltage of (VDD–$V_T$) to the gate of transistor MP7, and the A/K voltage generating circuit applies a voltage Vo2 that is the A/K voltage to the gate of transistor MP6. As a result, gate voltage Vo such that $V_{gs}=V_T+A/K$ is applied to the gate of transistor MN0 to eliminate the influence of power supply voltage VDD and temperature.

Figure 8B:
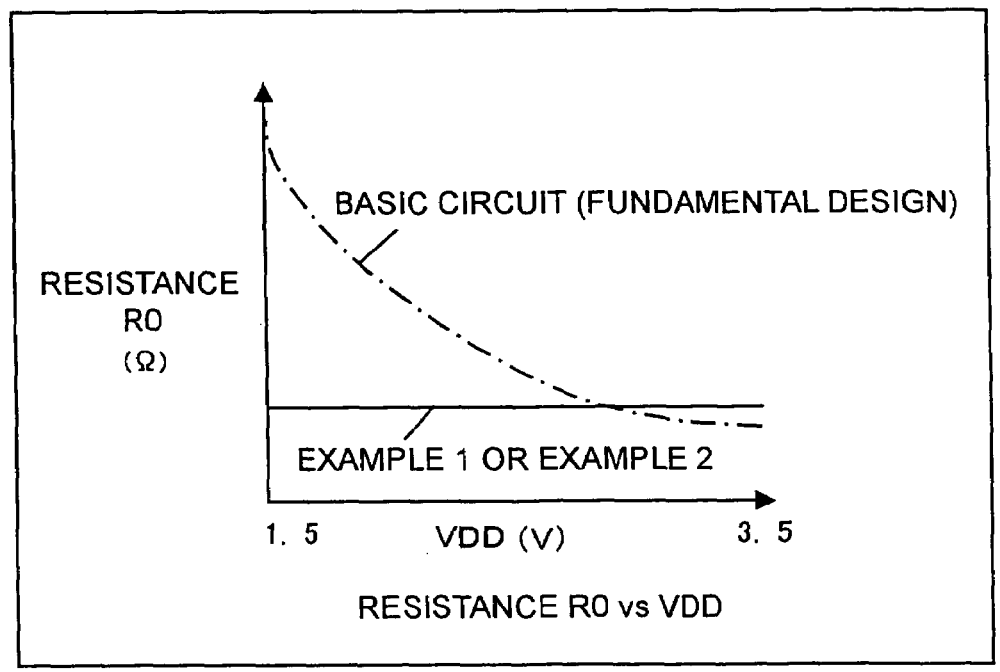
FIG. 8*b* is a characteristic graph of resistance R0 against VDD applied to the gate of the transistor.

Thus, as shown in FIGS. 8A, 8B, also in the Example 2 similarly to the Example 1, the resistance of the tuning circuit when resonant is rendered constant without being affected by the variation in power supply voltage VDD and temperature. Thus, as shown in FIGS. 10A, 10B, also in the Example 2 similarly to the Example 1, the amplitude of the AC signal output from the tuning circuit can be attenuated without being affected by the variation in power supply voltage VDD and temperature.

Figure 12:
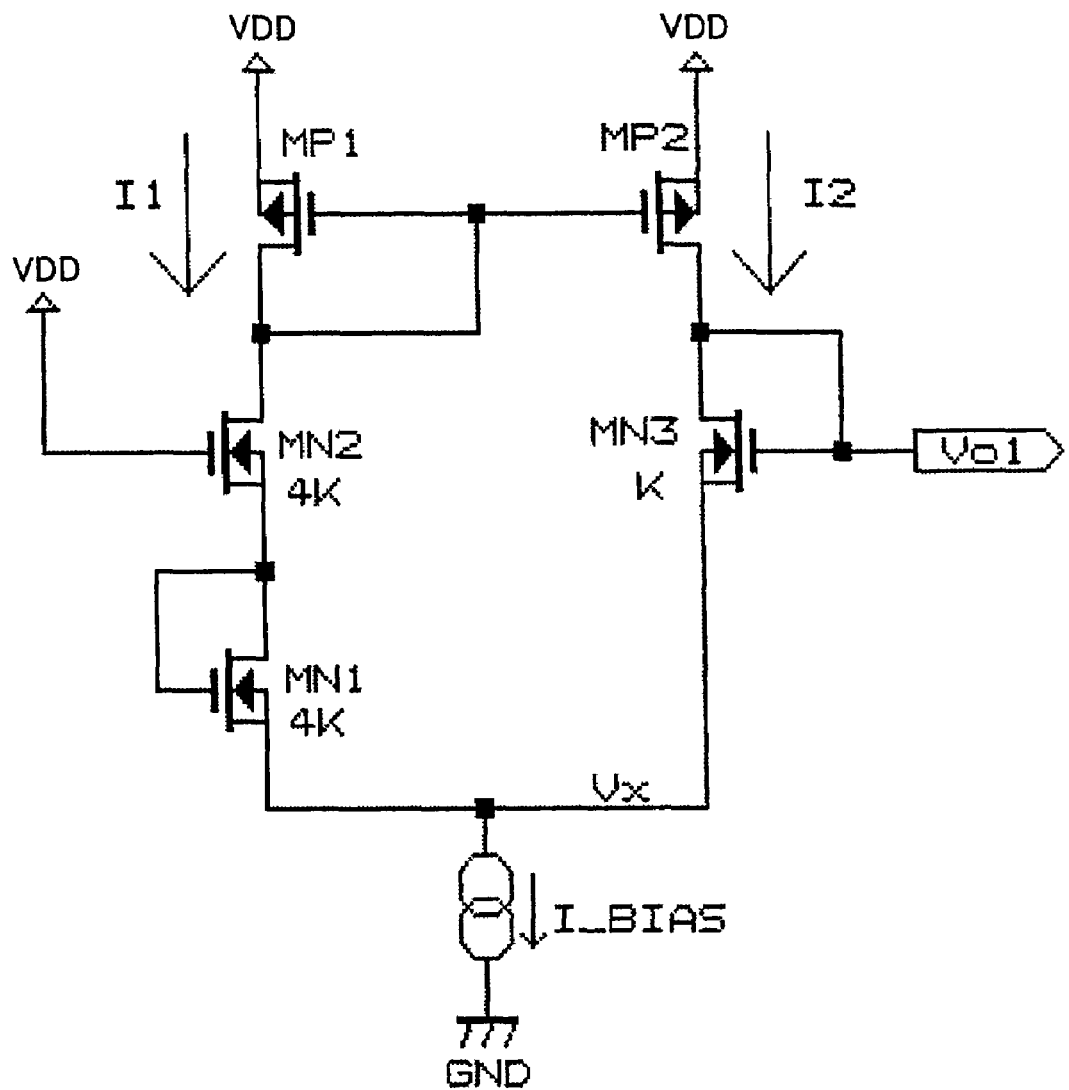
FIG. 12 is a circuit diagram of a specific example of a (VDD–VT) voltage generating circuit of the tuning circuit with the amplitude attenuation function according to Example 2 of the present invention.

A specific example of the (VDD–$V_T$) voltage generating circuit is the circuit shown in FIG. 12. As shown in the Figure, a circuit wherein transistors MP1, MP2 constituted by p-type channel MOSFETs and transistors MN1, MN2, MN3 constituted by n-type channel MOSFETs are combined and connected is connected to a constant current circuit, which is connected at one end to ground and causes the flow of a constant current $I_{BIAS}$. Transistors MP1, MN1, MN3 have their gate and source connected to function as a diode. The trans-conductance coefficients of transistors MN1, MN2, MN3 are in a ratio relationship, MN1: MN2: MN3=4K: 4K: K. Furthermore, the drains of transistors MP1, MP2 and the gate of transistor MN2 are supplied with power supply VDD potential.

Owing to the connection relationship shown in FIG. 12, a drain-to-source current I1 flows through transistor MP1, and a drain-to-source current I2 flows through transistor MP2. As a result, the voltage Vo1 is obtained at the gate of transistor MN3. This voltage Vo1 is the voltage of (VDD–$V_T$) applied to the gate of transistor MP7 in FIG. 11.

To describe in detail, all transistors operate in the saturation region by constant current $I_{BIAS}$, and $K_{MP1}$ is set equal to $K_{MP2}$ so that I1=I2. Drain-to-source current I1 of transistor MN2 is expressed as I1=4K{(VDD–$V_X$)/2–$V_T$}$^2$. Drain-to-source current I2 of transistor MN3 is expressed as I2=K(Vo1–$V_X$–$V_T$)$_2$. Because I1=I2, it is obtained that 4K{(VDD–$V_X$)/2–$V_T$}$^2$=K(Vo1–$V_X$–$V_T$)$^2$. Thus, it is found that (VDD–$V_T$–Vo1)×(VDD–3$V_T$–2$V_X$+Vo1)=0. Therefore, Vo1=VDD–$V_T$ or Vo1=3$V_T$+2$V_X$–VDD. Here, $V_T$ equals about 0.7V (constant). Further, because $I_{BIAS}$ is constant, $V_X$ is a constant. Hence, VDD being a variable, VDD–3$V_T$–2$V_X$+Vo1 is not equal to zero. Thus, Vo1=VDD–$V_T$.

Figure 13:
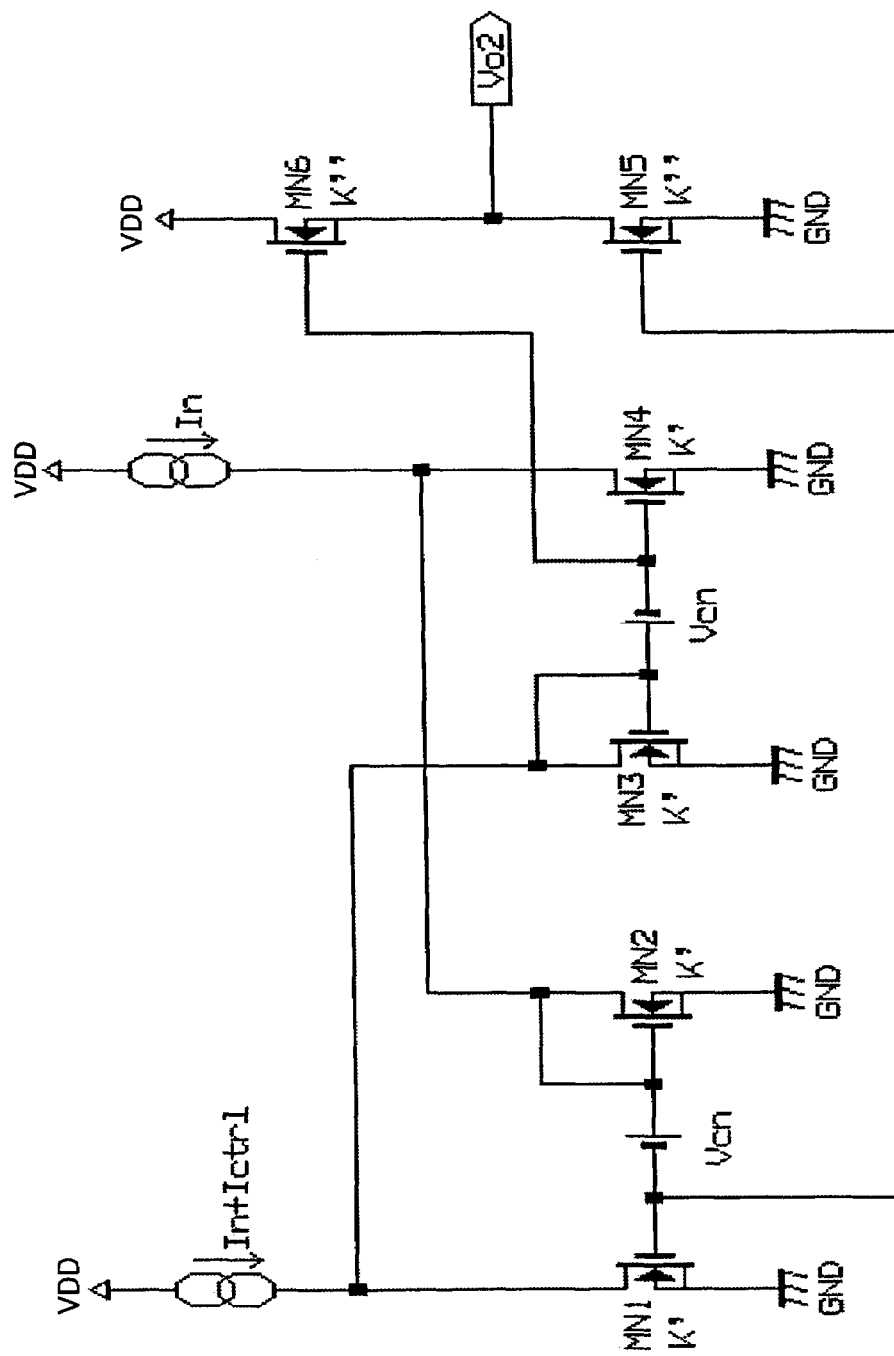
FIG. 13 is a circuit diagram of a specific example of an A/K voltage generating circuit of the tuning circuit with the amplitude attenuation function according to Example 2 of the present invention.

A specific example of the A/K voltage generating circuit is the circuit shown in FIG. 13. This A/K voltage generating circuit has a configuration wherein transistors MN1 to MN6 constituted by n-type channel MOSFETs and two constant current circuits connected at one ends to power supply VDD are connected as shown in the Figure, and generates voltage Vo2. This voltage Vo2 is the A/K voltage applied to the gate of transistor MP6 of FIG. 11. To describe in detail, the constant currents supplied from the constant current circuits are indicated by $I_n$ and $I_n+I_{ctrl}$, respectively. All transistors are made to operate in the saturation region. $V_{cn}$ is a constant voltage. It is set that $K'=K_{Mn1}=K_{Mn2}=K_{Mn3}=K_{Mn4}$ and $K''=K_{Mn5}=K_{Mn6}$. Since the sum of the currents flowing through transistors MN1, MN3 equals $I_n+I_{ctrl}$, it is obtained that $I_n+I_{ctrl}=K'(V_{gs1}-V_T)^2+K'(V_{gs3}-V_T)^2$. Here, since $V_{gs3}=V_{gs4}+V_{cn}$, $$I_n+I_{ctrl}=K'(V_{gs1}-V_T)^2+K'(V_{gs4}+V_{cn}-V_T)^2 \quad \text{(Eq. 1)}$$

Moreover, since the sum of the currents flowing through transistors MN2, MN4 equals $I_n$, it is obtained that $I_n=K'(V_{gs2}-V_T)^2+K'(V_{gs4}-V_T)^2$. Here, since $V_{gs2}=V_{gs1}+V_{cn}$, $$I_n=K'(V_{gs1}+V_{cn}-V_T)^2+K'(V_{gs4}-V_T)^2. \quad \text{(Eq. 2)}$$

Then, subtracting Equation 2 from Equation 1, $$I_{ctrl}=2K'\times V_{cn}(V_{gs4}-V_{gs1}). \quad \text{(Eq. 3)}$$

Here, since $K''=K_{Mn5}=K_{Mn6}$, $V_{th5}=V_{th6}$. Hence, from that $V_{gs5}=\text{Vo2}+V_{th5}$ and $V_{gs6}=V_{th6}$, it is found that Vo2=$V_{gs5}$–$V_{gs6}$. Accordingly, from that $V_{gs4}=V_{gs5}$ and $V_{gs6}=V_{gs1}$, it is found that Vo2=$V_{gs4}$–$V_{gs1}$. Substituting this equation into Equation 3, it is obtained that Vo2=$I_{cn}$/(2K'×$V_{cn}$). Letting A=$I_{cn}$/2$V_{cn}$, then Vo2=A/K is obtained.

Figure 14:
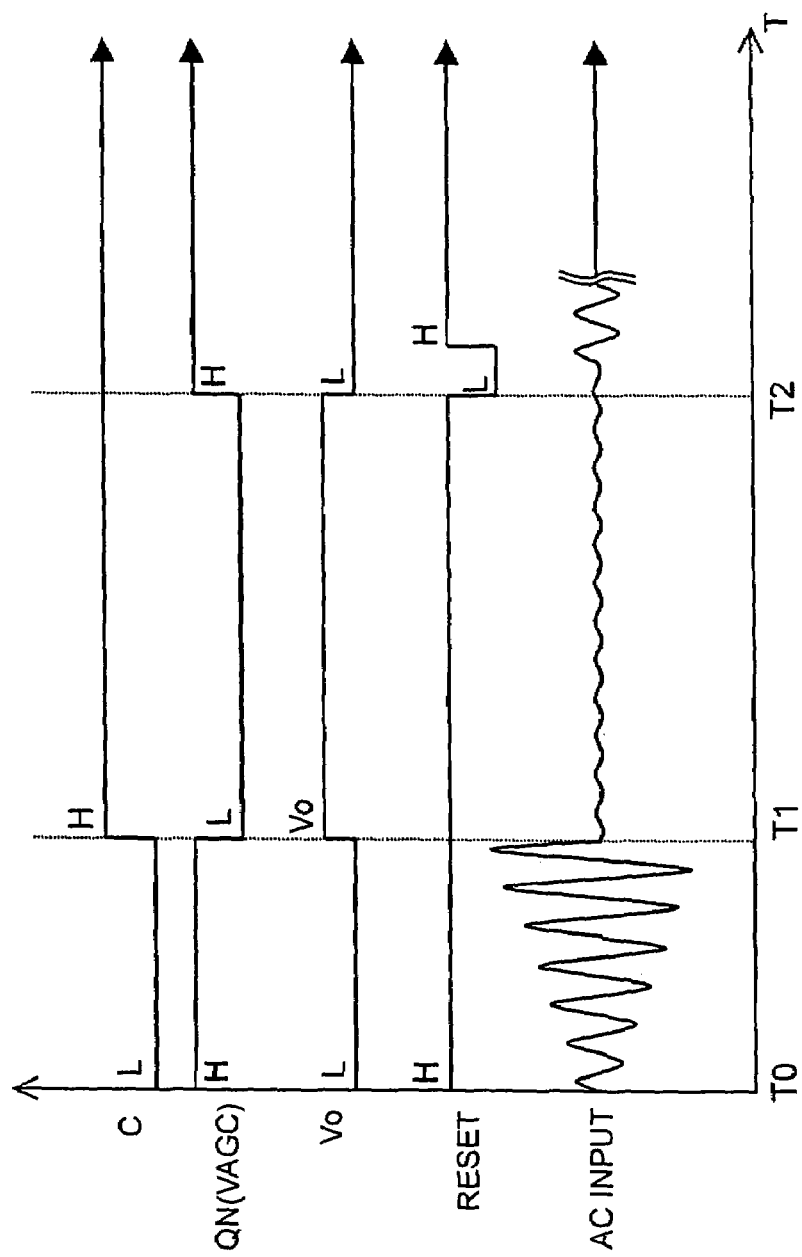
FIG. 14 is a waveform view showing the states of signals of the circuit of FIG. 11.

Here, AGC operation of the Example 2 will be described with reference to the circuit diagram of FIG. 11 and the waveform view of FIG. 14. Note that the description will be centered on differences from the description of operation of the circuit of FIG. 6. First, up to time T0 in FIG. 14, the transistor-driving digital circuit is in a reset state where the level-shifted AC signal from the tuning circuit is not input to the hysteresis comparator, during which the states of the signals are as follows. The output of the hysteresis comparator (indicated by C in FIGS. 11, 14), the gate voltage Vo of transistor MN0 are at a "L" level. Meanwhile, the output of D flip-flop FD2 (indicated by QN (VAGC) in FIGS. 11, 14) and the voltage applied to reset terminal RESET (indicated by RESET in FIGS. 11, 14) are at the "H" level. Because QN (VAGC) is at the "H", transistor MN1 is ON, and because transistor MN0 has near-ground voltage applied to the gate, transistor MN0 is OFF. Thus, the AGC operation for the tuning circuit does not start.

Then, after time T0 in FIG. 4, the level-shifted AC signal from the tuning circuit is input to the hysteresis comparator. In first several milliseconds from the time when an AC signal having an excessive amplitude starts to be input to the hysteresis comparator (from time T0 to T1), the hysteresis comparator changes its output C from "L" to "H" because the input level to the non-inverting input terminal is greater than the reference voltage to the inverting input terminal. Then, output QN (digital drive signal VAGC) of D flip-flop FD2 becomes inverted, i.e., the "L" level. As a result, the transistor MN1 becomes OFF, and thereby the gate voltage Vo equal to the $V_T$+A/K is applied to the gate of transistor MN0. Thus, AGC for the tuning circuit as with the circuit of FIG. 6 starts to work so as to suppress the amplitude of the AC signal.

Note that the voltage applied to reset terminal RESET is maintained at the "H" level. By this means, digital drive signal VAGC is held at the "L" level and the transistor MP0, a resistance-adjustment element, is held in an ON state. Thus, the stop of AGC operation can be prevented.

Thereafter, in order to stop the AGC operation and initialize the signal state of each part, a reset pulse signal is applied to reset terminal RESET (at time T2). Thereby, output QN (digital drive signal VAGC) of D flip-flop FD2 returns to the "H" level. As a result, the transistor MN1 becomes ON, and the transistor MN0 becomes OFF because near-ground voltage is applied to its gate. Thereby, the above AGC operation for the tuning circuit is stopped.

Moreover, the present aspect of the invention related to the above items to be improved can be applied to the basic circuit of the type shown in FIG. 2.

Application Example to Remote Control Systems

Figure 15:
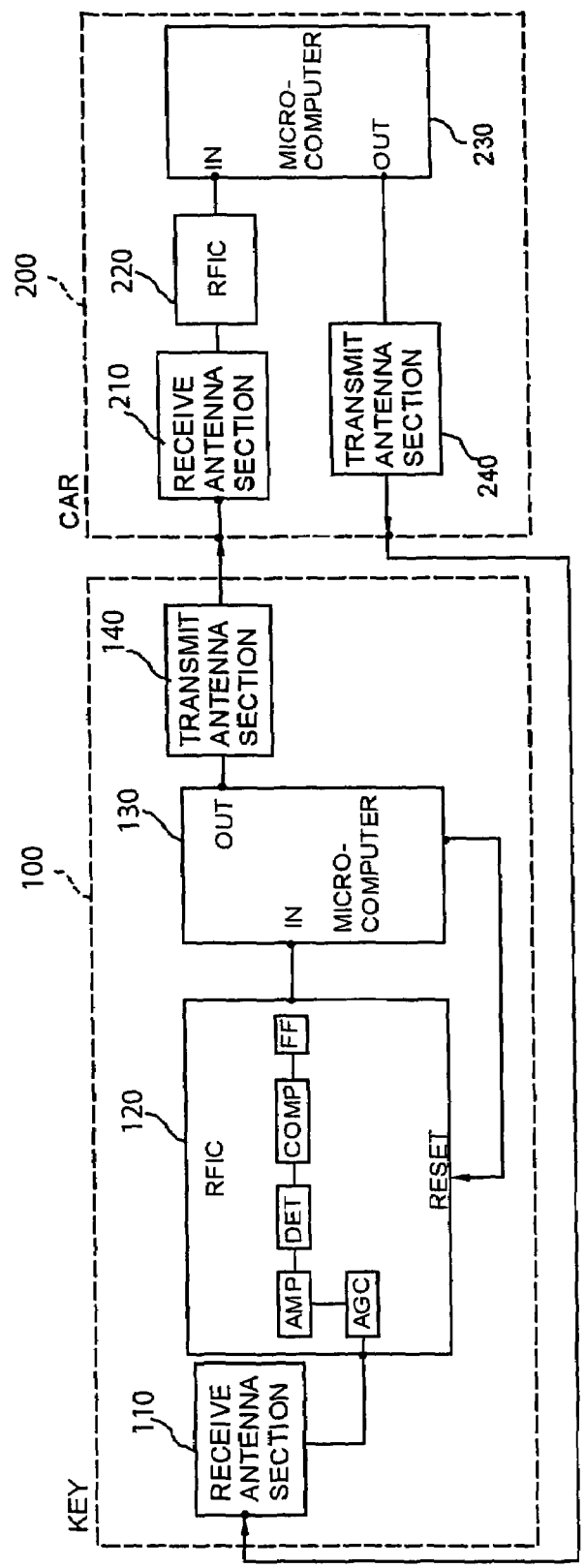
FIG. 15 is a block diagram showing an application example where the tuning circuit with the amplitude attenuation function according to the embodiment of the present invention is used in a wireless door lock remote control system for a car.

An application example of the tuning circuits having the amplitude attenuation function described in the above embodiment and modified example will be described with reference to FIG. 15. In this application example, the present invention is applied to a wireless door lock (or engine start/stop) remote control system (bidirectional communication keyless entry system) for a key 100 and a car 200.

Key 100 comprises a receive antenna section 110, an RF (Radio Frequency) IC (Integrated Circuit) 120, a microcomputer 130, and a transmit antenna section 140 including an LC oscillation circuit. Receive antenna section 110 is the tuning circuit having the coil L1 and the capacitor C1 of FIG. 3, 6, 9, or 11 of the invention. RFIC 120 comprises the AGC circuit including transistor MP0 or MN0 of FIG. 3 or 6 of the invention. RFIC 120 further comprises, as well known, an amplifier AMP for amplifying the AC signal from the AGC, a detection circuit DET, a comparator COMP, and a flip-flop FF. The microcomputer 130 processes the output signal of this flip-flop FF and performs ASK transmission or FSK (Frequency Shift Keying) transmission via data output terminal DATAOUT and transmit antenna section 140.

Meanwhile, car 200 includes a receive antenna section 210, a RFIC 220, a microcomputer 230, and a transmit antenna section 240, which are configured similarly to receive antenna section 110, RFIC 120, microcomputer 130, and transmit antenna section 140 of key 100 respectively and perform processing of communication with the key 100 side.

Alterative circuits and the like equivalent in function to the resistance-adjustment element of the present invention are within the scope of the invention.

Although the preferred embodiment of the present invention has been described in detail, it should be understood that various changes, substitutions and alterations can be made therein without departing from spirit and scope of the inventions as defined by the appended claims.

It is claimed:

1. A tuning circuit having a coil and a capacitor, comprising:
   a resistance-adjustment circuit connected in parallel with the coil and the capacitor, the resistance-adjustment circuit changing a resistance of the tuning circuit when resonant, the resistance-adjustment circuit comprising a series circuit of a resistor and a switching element having an ON-resistance smaller than the resistance of the resistor,
   wherein turning on/off the switching element based on an amplitude of an output signal of the tuning circuit causes the resistance of the tuning circuit when resonant to change.

2. The tuning circuit according to claim 1, wherein the switching element is constituted by a transistor, and turning on/off the transistor causes the resistance of the tuning circuit when resonant to change.

3. The tuning circuit according to claim 2, further comprising an automatic adjustment circuit,
   the automatic adjustment circuit comprising:
   a comparator that changes its output when the amplitude of the output signal of the tuning circuit becomes greater than a reference amplitude level for automatic adjustment; and
   a transistor driving digital circuit that outputs a digital drive signal to change a voltage applied to a control electrode of the transistor in response to the change in the output of the comparator.

4. An integrated circuit for a radio communication apparatus comprising:
   the resistance-adjustment circuit and the automatic adjustment circuit in the tuning circuit according to claim 3.

5. A tuning circuit having a coil and a capacitor, comprising:
   a switching element connected in parallel with the coil and the capacitor, the switching element changing a resistance of the tuning circuit when resonant,
   wherein changing the resistance by the switching element changes the amplitude of an output signal of the tuning circuit,
   the tuning circuit further comprising:
   a circuit to render an ON-resistance constant that eliminates dependency of the ON-resistance of the switching element on a power supply voltage, which is a source of a switching voltage for the switching element, and on temperature,
   wherein the circuit to render an ON-resistance constant supplies the switching element with the switching voltage to eliminate the dependency on the power supply voltage and on the temperature.

6. The tuning circuit according to claim 5, wherein the switching element is constituted by a transistor, and turning on/off the transistor causes the resistance of the tuning circuit when resonant to change.

7. The tuning circuit according to claim 6, further comprising:
   a (VDD–VT) voltage generating circuit to generate a difference voltage of (VDD–VT) between the power supply voltage VDD and a threshold voltage VT of the transistor; and
   an A/K voltage generating circuit to generate an A/K voltage coffesponding to the result of dividing a predetermined constant A by a trans-conductance coefficient K,
   wherein the circuit to render an ON-resistance constant generates, as the switching voltage applied to a control electrode of the transistor as the switching element, a voltage of VT+A/K, equal to the sum of the threshold voltage VT and the A/K voltage, produced based on the voltage of (VDD−VT) and the A/K voltage supplied so that the ON-resistance of the transistor equals the reciprocal of the predetermined constant A.

8. The tuning circuit according to claim 5, further comprising:

an automatic adjustment circuit including:

a comparator that changes its output when the amplitude of the output signal of the tuning circuit becomes greater than a reference amplitude level for automatic adjustment; and a transistor driving digital circuit that outputs a digital drive signal to change a voltage applied to a control electrode of the transistor in response to the change in the output of the comparator.

9. An integrated circuit for a radio communication apparatus comprising:

the switching element and the automatic adjustment circuit in the tuning circuit according to claim 8.

* * * * *

UNITED STATES PATENT AND TRADEMARK OFFICE
CERTIFICATE OF CORRECTION

PATENT NO. : 7,330,708 B2
APPLICATION NO. : 11/001460
DATED : February 12, 2008
INVENTOR(S) : Umewaka et al.

It is certified that error appears in the above-identified patent and that said Letters Patent is hereby corrected as shown below:

Column 16 line 62, replace "coffesponding" with --corresponding--.

Signed and Sealed this

Twenty-seventh Day of May, 2008

JON W. DUDAS
*Director of the United States Patent and Trademark Office*